United States Patent
Bouche et al.

(10) Patent No.: US 7,038,355 B2
(45) Date of Patent: May 2, 2006

(54) TUNABLE MICRORESONATOR ON AN INSULATING BEAM DEFORMABLE BY THE DIFFERENCE IN THERMAL EXPANSION COEFFICIENTS

(75) Inventors: Guillaume Bouche, Grenoble (FR); Pascal Ancey, Revel (FR); Grégory Caruyer, Goncelin (FR)

(73) Assignee: STMicroelectronics SA, Montrouge (FR)

( * ) Notice: Subject to any disclaimer, the term of this patent is extended or adjusted under 35 U.S.C. 154(b) by 15 days.

(21) Appl. No.: 10/814,619

(22) Filed: Mar. 31, 2004

(65) Prior Publication Data

US 2004/0251781 A1 Dec. 16, 2004

(30) Foreign Application Priority Data

Apr. 3, 2003 (FR) .................................. 03 04147

(51) Int. Cl.
*H02N 2/00* (2006.01)
*H01L 41/00* (2006.01)
(52) U.S. Cl. .................. 310/324; 367/163; 310/343; 310/306; 310/307
(58) Field of Classification Search ................ 310/365, 310/366, 324, 346, 321, 315
See application file for complete search history.

(56) References Cited

U.S. PATENT DOCUMENTS

| 3,916,348 A | | 10/1975 | Toda et al. ................ 333/30 R |
| 5,065,978 A | * | 11/1991 | Albarda et al. ............. 257/419 |
| 5,796,152 A | * | 8/1998 | Carr et al. ................... 257/415 |
| 5,844,471 A | * | 12/1998 | Daniel ......................... 340/436 |
| 5,969,465 A | | 10/1999 | Neukermans et al. ....... 310/333 |
| 6,441,539 B1 | * | 8/2002 | Kitamura et al. ........... 310/346 |
| 2003/0057806 A1 | * | 3/2003 | Peczalski ..................... 310/324 |
| 2005/0028336 A1 | * | 2/2005 | Robert et al. .............. 29/25.35 |

FOREIGN PATENT DOCUMENTS

| DE | 101 24 349 A1 | 12/2002 |
| EP | 1 180 494 A2 | 2/2002 |

OTHER PUBLICATIONS

Tang, W., "Microengineered Actuators: A Review," in *Proceedings of the 4031166 Electro International Conference Record,* New York, NY, Apr. 16-18, 1991, pp. 104-109.

* cited by examiner

*Primary Examiner*—Darren Schuberg
*Assistant Examiner*—J. Aguirrechea
(74) *Attorney, Agent, or Firm*—Lisa K. Jorgenson; Robert Iannucci; Seed IP Law Group PLLC

(57) ABSTRACT

A device comprising a resonator formed of a piezoelectric layer sandwiched between two metal electrodes, the resonator being laid on a suspended beam, the device comprising means for deforming said beam by the difference in thermal expansion coefficients.

20 Claims, 1 Drawing Sheet

TUNABLE MICRORESONATOR ON AN INSULATING BEAM DEFORMABLE BY THE DIFFERENCE IN THERMAL EXPANSION COEFFICIENTS

BACKGROUND OF THE INVENTION

1. Field of the Invention

The present invention relates to the field of piezoelectric microresonators.

2. Discussion of the Related Art

A piezoelectric microresonator conventionally comprises a piezoelectric layer sandwiched between two conductive electrodes. Such a microresonator is likely to start resonating when the signal applied between its electrodes is at a determined frequency.

Apart from any external influence, the resonance frequency of a microresonator is set upon manufacturing, especially according to the thickness and to the nature of the piezoelectric layer. Now, for many circuits such as settable analog filters, it is desirable to be able to vary the resonance frequency of microresonators.

SUMMARY OF THE INVENTION

An object of the present invention is to provide a tunable microresonator.

To achieve this object, the present invention provides a device comprising a resonator formed of a piezoelectric layer sandwiched between two metal electrodes, the resonator being laid on a suspended beam, the device comprising means for deforming said beam by the difference in thermal expansion coefficients.

According to an alternative of the device of the present invention, the means for deforming the beam comprise heating elements and one or several blocks in contact with the beam, the blocks being formed of a material having a thermal expansion coefficient different from that of the beam.

According to an alternative of the above-mentioned device, the heating elements are placed within the beam.

According to an alternative of the device of the present invention, electrodes are placed in the beam opposite to other electrodes external to the beam, the electrodes being connected to a voltage source capable of biasing the electrodes to maintain the beam deformation.

According to an alternative of the above-mentioned device, the beam is placed above a cavity formed in a substrate, the external electrodes being placed in the cavity.

The present invention also provides an integrated circuit comprising a resonator such as that described hereabove.

The foregoing objects, features, and advantages of the present invention will be discussed in detail in the following non-limiting description of specific embodiments in connection with the accompanying drawings.

DETAILED DESCRIPTION OF THE INVENTION

The various drawings are not drawn to scale but are drawn to make clear various features of the invention.

Figure 1:
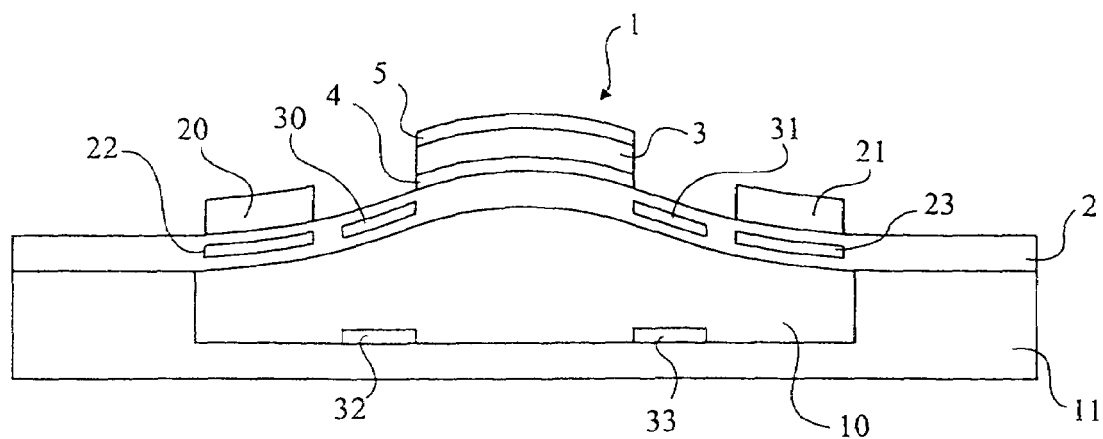
FIG. 1 is a cross-section view of an embodiment of the device of the present invention at rest.
Figure 2:
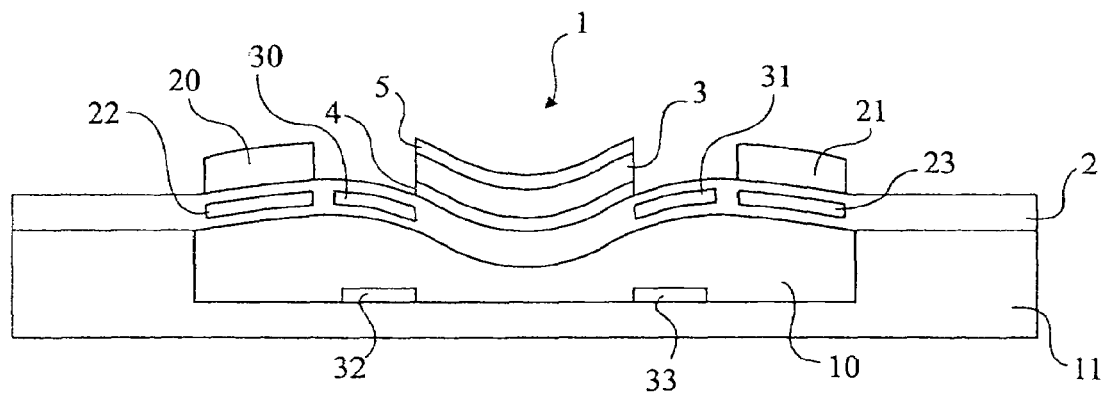
FIG. 2 is a cross-section view of the device of the present invention in a "deformed" state.

The device of the present invention, shown in FIGS. 1 and 2, comprises a resonator 1 laid on a beam 2 suspended on its two ends. Resonator 1 is formed of a stack of thin layers and comprises a piezoelectric layer 3 sandwiched between two conductive electrodes 4 and 5. Other materials that are well known in the industry could also be used for each of the layers 3, 4 and 5. Piezoelectric layer 3 is for example formed of aluminum nitride AlN and the electrodes are for example formed of aluminum, molybdenum, or platinum. Beam 2 is a thin strip of an insulating material, acceptable materials being any semiconductor insulator such as silicon nitride (SiN), silicon dioxide, a glass, TEOS, or other layer. Beam 2 is suspended above a cavity 10 formed in a substrate 11. The ends of beam 2 are laid on substrate 11 on either side of cavity 10.

Figure 3:
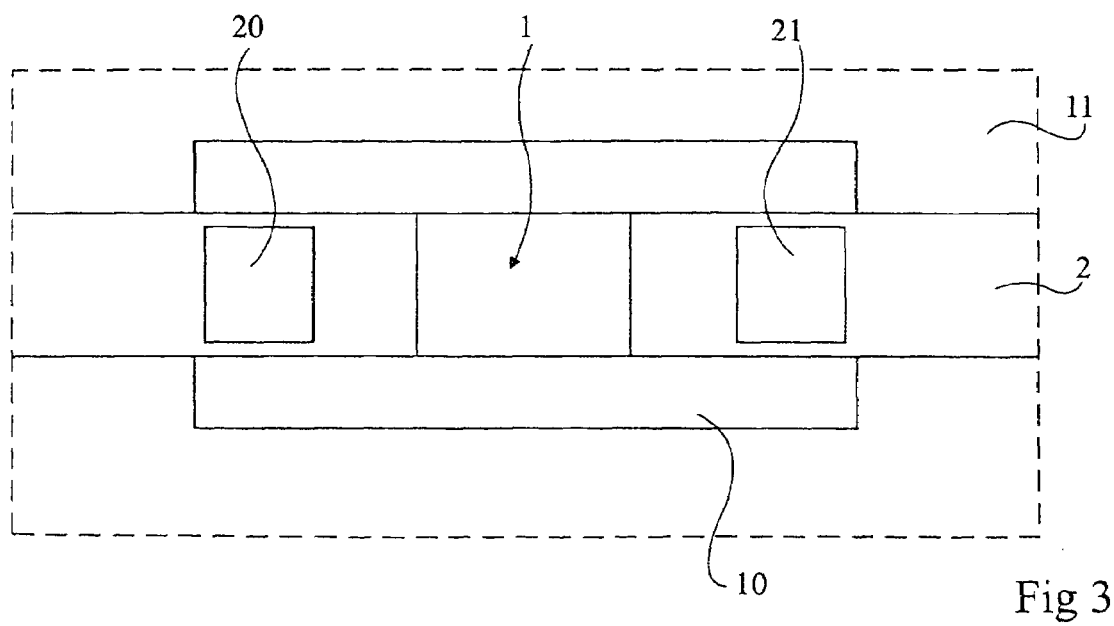
FIG. 3 is a top view of the device of the present invention.

As illustrated in FIG. 3, in top view, the lateral edges of beam 2 are spaced apart from the edges of cavity 10.

Substrate 11 may be formed of any type of material. In the case where the device of the present invention belongs to an integrated circuit, substrate 11 may be the passivation layer covering the interconnect network circuit or be the insulating layer separating the last and the penultimate circuit interconnect levels. In the case where the device is a discrete component, substrate 11 may be a silicon semiconductor wafer or an insulating layer, for example, silicon oxide, laid on a support wafer, for example, silicon.

According to an aspect of the present invention, the device comprises means for deforming beam 2 by the difference in thermal expansion coefficients. Resonator 1 being laid on the resonator beam, a deformation of beam 2 results in a deformation of the resonator. Now, the resonance frequency varies according to the deformation of resonator 1.

In the example of the device shown in FIGS. 1 and 2, metal blocks 20 and 21 are laid on beam 2. Resonator 1 is placed at the center of the portion of beam 2 located above cavity 10. Blocks 20 and 21 are placed on either side of resonator 1. Heating resistors 22 and 23 are placed under blocks 20 and 21 within beam 2. Heating resistors 22 and 23 are for example formed of a titanium nitride layer TiN and are supplied via connections not shown. Process steps for forming a cavity under a suspended beam having the components as shown in FIGS. 1-3 are well known in the art and thus are not described herein since any of the many known ways are acceptable.

To best diffuse the heat generated by the heating resistors in beam 2 to metal blocks 20 and 21, the heating resistors preferably have in top view a width close to the beam width and extend over the entire beam area located under blocks 20 and 21. Further, the heat generated by heating resistors 22 and 23 being proportional to their resistance, their thickness can be reduced to a minimum.

To switch from the resting state to the deformed state, such as respectively illustrated in FIGS. 1 and 2, an activation circuit, not shown, conducts current into heating resistors 22 and 23, which results in heating blocks 20 and 21 and beam 2. Since the aluminum of blocks 20 and 21 has an expansion coefficient greater than the silicon nitride of beam 2, blocks 20 and 21 lengthen more than beam 2. Accordingly, the beam ends slightly bulge upwards and the central portion of the beam bends downwards. During the deformation of beam 2, microresonator 1 laid on beam 2 progressively bends, its ends curving upwards.

In one embodiment, the beam 2 is flat across the cavity 10; in another embodiment, the beam 1 is formed with a slightly upward curve, as shown in FIG. 1. To have a great latitude of deformation of beam 2, and thus of resonator 1, beam 2 may have at rest a shape slightly bulged upwards, as shown in FIG. 1.

Generally, blocks 20 and 21 laid on beam 2 must be formed of a material having a thermal expansion coefficient different from that of beam 2 so that the block and beam assembly twists as the temperature increases. In the case where metal blocks 20 and 21 have a smaller thermal expansion coefficient than that of beam 2, it may be provided to place the blocks under beam 2.

Since the resonator's resonance frequency varies according to its deformation, the activation circuit may set the resonator's resonance frequency to different values by conducting a stronger or lighter control current into heating resistors 22 and 23 to more or less deform resonator 1. Further, the activation circuit may comprise a control device capable of determining the current resonance frequency of the resonator and of modifying the intensity of the control current to adjust, if necessary, the resonance frequency to exactly have a desired value.

To maintain the beam deformation, and thus the resonator, without consuming too high a current in heating resistors 22 and 23, the present invention provides, optionally, placing internal electrodes 30 and 31 into beam 2, and placing external electrodes 32 and 33 at the bottom of cavity 10 opposite to internal electrodes 30 and 31. Once the beam has been deformed under the action of the difference in thermal expansion coefficients, it is possible to maintain the deformation by electrostatic attraction by applying a voltage between internal electrodes 30/31 and external electrodes 32/33, these various electrodes being associated with connection means, not shown.

Internal electrodes 30 and 31 are for example formed of a thin titanium nitride layer (TiN) like heating elements 22 and 23. External electrodes 32 and 33 may be made of aluminum, copper, an alloy of aluminum and copper, or even gold, which has the advantage of not oxidizing in the air. External electrodes 32 and 33 may be portions of one of the upper or of the last interconnect level of an integrated circuit or a separate metal layer.

As a non-limiting example, the dimensions of the different elements of the device of the present invention are the following:
 thickness of the resonator electrodes: 0.1 μm
 thickness of the resonator's piezoelectric layer: 2 μm
 resonator width/length: 150 by 150 μm
 beam thickness: 2 μm
 beam width/length: 200 by 500 μm
 aluminum block thickness: 2 μm
 thickness of the titanium/aluminum heating resistors: 0.5 μm
 width/length of the heating resistors: 200 by 200 μm$^2$
 thickness of the internal titanium nitride/aluminum internal electrodes: 0.5 μm
 thickness of the external gold electrodes: 1 μm
 depth of the cavity: 10 μm With such a device, it is for example possible to vary the resonance frequency of the resonator by several MHz (for a resonator centered on 2 GHz).

A device according to the present invention comprises lines of access, not shown, to electrodes 4 and 5 of microresonator 1. Such access lines are for example placed on beam 2. To connect upper electrode 5 of the resonator to an access line located on the beam, the device comprises, for example, a thin piezoelectric strip laid on beam 2 and juxtaposed to piezoelectric layer 3. The upper electrode extends in a thin conductive strip located above the thin piezoelectric strip. An insulated conductive via crossing the thin piezoelectric strip enables connecting the thin conductive strip to an access line placed on the beam.

Similarly, the device comprises lines of access to heating resistors 22 and 23 and to internal electrodes 30 and 31. Such access lines may be metal areas placed in, on, or under beam 2.

The resonator electrodes, heating resistors 22 and 23, internal electrodes 30 and 31, and external electrodes 32 and 33 may be connected to connection pads or to elements of an integrated circuit.

In the case where the device is a discrete component, the connection pads may be formed on the rear surface of substrate 11, the front surface being that where the resonator is formed.

Whether the device is a discrete component or belongs to an integrated circuit, the various above-mentioned elements may be connected to a network of connections placed under the substrate or to a rear surface connection pad via vias formed in the substrate and possibly vias formed in the beam in the case where the elements are placed on the beam.

In the case where the device of the present invention belongs to an integrated circuit, external electrodes 32 and 33 may be portions of the last interconnect level. The external electrodes are then directly connected to the interconnect network of the circuit.

Of course, the present invention is likely to have various alterations, modifications, and improvements which will readily occur to those skilled in the art. In particular, those skilled in the art will devise other devices of beam deformation by the difference in thermal expansion coefficients. Expandable elements having an expansion coefficient different from that of the beam may be placed around, under or/and on the beam. The expandable elements may possibly be separated from the beam by a dielectric layer. The heating resistors may be placed on the beam or on the expandable elements.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
 a resonator formed of a piezoelectric layer sandwiched between two metal electrodes, the resonator being laid on a suspended beam, and
 means for deforming said beam by a difference in thermal expansion coefficients.

2. The device of claim 1, wherein the means for deforming the beam comprise heating elements and one or several blocks in contact with the beam, the blocks being formed of a material having a thermal expansion coefficient different from that of the beam.

3. The device of claim 2, wherein the heating elements are placed within the beam.

4. The device of claim 1, wherein electrodes are placed in the beam opposite to other electrodes external to the beam, the electrodes being connected to a voltage source capable of biasing the electrodes to maintain the beam deformation.

5. The device of claim 4, wherein the beam is placed above a cavity formed in a substrate, the external electrodes being placed in the cavity.

6. An integrated circuit comprising the device of claim 1.

7. A device, comprising:
- a deformable bridge;
- a resonator positioned on said bridge, said resonator having a piezoelectric layer and first and second electrodes coupled to the piezoelectric layer;
- a thermally responsive material mechanically coupled to said bridge, the thermally responsive material having a thermal expansion coefficient that is different from the bridge's thermal expansion coefficient; and
- a heating element positioned adjacent to the thermally responsive material, wherein the thermally responsive material is structured to expand in a manner that deforms the bridge when the thermally responsive material is heated by the heating element.

8. The device according to claim 7 wherein the thermally responsive material is a metal.

9. The device according to claim 7 wherein the thermally responsive material is an aluminum-based material.

10. The device according to claim 7, further including:
- a cavity positioned under the bridge.

11. The device according to claim 7 wherein the bridge is composed of silicon nitride.

12. The device according to claim 7 wherein the thermally responsive material is positioned on an upper surface of said bridge and has a larger thermal coefficient of expansion than said bridge, thereby causing a central region of the bridge to bend downward when the device is heated.

13. The device of claim 7, wherein the heating element is placed within the bridge.

14. The device of claim 7, further comprising:
- a third electrode positioned in the bridge;
- a fourth electrode position external to the bridge and opposite to the third electrode; and
- a voltage source connected to the third and fourth electrodes and structured to apply a voltage between the third and fourth electrodes in a manner that maintains the bridge in a deformed state by electrostatic attraction between the third and fourth electrodes.

15. The device of claim 14, wherein the bridge is placed above a cavity formed in a substrate, the fourth electrode being placed in the cavity.

16. A device, comprising:
- a piezoelectric resonator having a piezoelectric layer positioned between first and second electrodes;
- a deformable suspension beam suspended across a cavity, the resonator being supported by the suspension beam and positioned above the cavity;
- an expandable element mechanically coupled to said bridge, the expandable element having a thermal expansion coefficient that is different from a thermal expansion coefficient of the suspension beam; and
- a heating element positioned adjacent to the expandable element, wherein the expandable element is structured to expand in a manner that deforms the suspension beam when the expandable element is heated by the heating element.

17. The device of claim 16 wherein the expandable element is positioned on an upper surface of the suspension beam and has a larger thermal coefficient of expansion than said bridge, thereby causing a central region of the bridge to bend downward when the expandable element is heated.

18. The device of claim 16, wherein the heating element is placed within the suspension beam.

19. The device of claim 16, further comprising:
- a third electrode positioned in the suspension beam;
- a fourth electrode position external to the suspension beam and opposite to the third electrode; and
- a voltage source connected to the third and fourth electrodes and structured to apply a voltage between the third and fourth electrodes in a manner that maintains the suspension beam in a deformed state by electrostatic attraction between the third and fourth electrodes.

20. The device of claim 19, wherein the fourth electrode being placed in the cavity.

\* \* \* \* \*